(12) United States Patent
Bink et al.

(10) Patent No.: US 7,827,372 B2
(45) Date of Patent: Nov. 2, 2010

(54) INTERGRATED CIRCUIT AND A METHOD OF CACHE REMAPPING

(75) Inventors: Adrianus Josephus Bink, Eindhoven (NL); Paul Stravers, Eindhoven (NL)

(73) Assignee: NXP B.V., Eindhoven (NL)

( * ) Notice: Subject to any disclaimer, the term of this patent is extended or adjusted under 35 U.S.C. 154(b) by 138 days.

(21) Appl. No.: 10/570,290

(22) PCT Filed: Aug. 17, 2004

(86) PCT No.: PCT/IB2004/051465

§ 371 (c)(1),
(2), (4) Date: Feb. 28, 2006

(87) PCT Pub. No.: WO2005/024843

PCT Pub. Date: Mar. 17, 2005

(65) Prior Publication Data

US 2007/0005897 A1  Jan. 4, 2007

(30) Foreign Application Priority Data

Sep. 4, 2003  (EP)  ................................. 03103289

(51) Int. Cl.
*G06F 12/00* (2006.01)
*G06F 13/00* (2006.01)
*G06F 13/28* (2006.01)

(52) U.S. Cl. ........................... 711/165; 711/3; 711/118; 711/128; 714/8

(58) Field of Classification Search ...................... 714/8; 711/3, 165, 118, 128
See application file for complete search history.

(56) References Cited

U.S. PATENT DOCUMENTS

| 4,868,869 | A | * | 9/1989 | Kramer ........................ 381/61 |
| 4,905,141 | A | * | 2/1990 | Brenza ........................ 711/129 |
| 5,019,971 | A | * | 5/1991 | Lefsky et al. .................. 714/5 |
| 5,070,250 | A | * | 12/1991 | Komatsu et al. ............ 250/548 |
| 5,519,846 | A | * | 5/1996 | Swenson .................... 711/130 |
| 5,584,002 | A | * | 12/1996 | Emma et al. ..................... 711/3 |
| 5,666,482 | A | | 9/1997 | McClure |
| 5,829,026 | A | * | 10/1998 | Leung et al. ................. 711/122 |
| 5,958,068 | A | | 9/1999 | Arimilli et al. |
| 5,978,888 | A | * | 11/1999 | Arimilli et al. ............... 711/128 |
| 6,393,504 | B1 | | 5/2002 | Leung et al. |
| 6,408,401 | B1 | * | 6/2002 | Bhavsar et al. .................. 714/7 |
| 6,467,048 | B1 | | 10/2002 | Olarig et al. |
| 6,671,822 | B1 | * | 12/2003 | Asher et al. ..................... 714/8 |
| 6,725,336 | B2 | * | 4/2004 | Cherabuddi ................. 711/129 |
| 2001/0039601 | A1 | | 11/2001 | Leung et al. |
| 2002/0065988 | A1 | * | 5/2002 | Lasserre et al. ............. 711/122 |

OTHER PUBLICATIONS

Yamashita, K. et al. "A Design and Yield Evaluation Technique for Wafer-Scale Memory", Computer, vol. 25, issue 4, pp. 19-27 (Apr. 1992).

(Continued)

*Primary Examiner*—Stephen C Elmore
*Assistant Examiner*—Mark A Giardino, Jr.

(57) ABSTRACT

An integrated circuit is provided with at least one processing unit (TM), a cache memory (L2 BANK) having a plurality of memory modules, and remapping means (RM) for performing an unrestricted remapping within said plurality of memory modules. Accordingly, faulty modules can be remapped without limitations in order to optimise the utilization of the memory modules by providing an even distribution of the faulty modules.

20 Claims, 6 Drawing Sheets

OTHER PUBLICATIONS

Otterstedt, et al. "Test and Reconfiguration Experiments for a Defect-Tolerant Large Area Monolithic Multiprocessor System", Proc. of Int. Conf. on Wafer Scale Integration, San Franciso, pp. 315-323 (Jan. 1994).

Lu, et al. "Fault-Tolerant Interleaved Memory Systems With Two-Level Redundancy", IEEE Trans. on Computers, vol. 46, No. 9 (Sep. 1997).

Shirvani, et al. "PADded Cache: A New Fault-Tolerance Technique for Cache Memories", Proc. 17th IEEE VLSI Test Symposium (1999).

Chakraborty, K. et al. "A Physical Design Tool for Build-In Self-Repairable Static Rams", Proc. of the Conf. on Design, Automation, and Test in Europe, Munich, DE (1999).

Low, "An Efficient Reconfiguration Algorithm for Degradable VLSI/WSI Arrays", IEEE Trans. on Computers, vol. 49, No. 6, pp. 553-559 (Jun. 2000).

Baik, et al. "Re-evaluation and Comparison of Fault Tolerant Cache Schemes", Univ. of Wisconsi Madison EEC Dept. 753 Course Project (2002).

International Preliminary Report on Patentability for Int'l. Patent Appln. No. PCT/IB2004/51465 (Mar. 6, 2006).

\* cited by examiner

INTERGRATED CIRCUIT AND A METHOD OF CACHE REMAPPING

FIELD OF THE INVENTION

The invention relates to an integrated circuit and a method of cache remapping.

BACKGROUND OF THE INVENTION

The increasing demand for memory bandwidth in recent high-performance VLSI processors is not satisfied by existing memory technology. In "Fault-Tolerant Interleaved Memory Systems with Two-Level Redundancy", by Lu et al in IEEE Transactions on Computers, Vol. 46, No. 9, September 1997, several memory banks or modules of a main memory are accessed by processors in an interleaved fashion, in order to achieve a memory with high bandwidth. However, if a plurality of memory modules are used, some of these modules might be faulty. To cope with these faulty modules Lu et al proposes to use a memory containing a plurality of modules as well as to provide some spare modules in said memory. These spare modules may belong to the same bank or may constitute global spare modules. If a faulty module occurs, the memory management may initiate a replacement of this faulty module by one of the spare modules. A module map table is provided for selecting a spare module to replace a faulty one and a bank map table is provided for selecting a spare bank to replace a faulty bank. Nonetheless, the teachings of Lu et al relate to the communication between processors and main memory having redundant memory modules without any caches between the processors and the main memory, which does not appear to be beneficial in terms of latency and bandwidth.

In contrast to the above, the extensive use of on-chip cache memories have become essential to sustain the memory bandwidth demand of the CPU. The advances in semiconductor technology and continuous down scaling of feature size creates extra-space for additional functionality on single chip. The most popular way to make use of this extra space is integrating a cache of bigger size so that a microprocessor is able to gain higher performance. However, an increase in the circuit density is closely coupled with an increase in probability of defects. Caches constitute a redundant structure which is employed to enhance the performance of the CPU. One method to tolerate faults in the cache is providing spare cache blocks. The defective block is switched to a spare block by a reconfiguration mechanism, or by providing small fully associative cache to dynamically replace the faulty block.

However, since the provision of caches with spare or redundant memory modules is expensive, new techniques being able to sooth the degradation of cache performance without spare cache blocks are needed. Therefore, instead of using explicit spare blocks, the physical or logical neighborhood blocks play the role of spare block. Dong-Hyun et al, "Re-evaluation and Comparison of Fault Tolerant Cache Schemes", University of Wisconsin Madison ECE Dept. 753 Course Project, 2002, as well as Shirvani et al, "PADded Cache: A New Fault-Tolerance Technique for Cache Memories", Proc. 17.sup.th IEEE VLSI Test Symposium, 1999 describe a Programmable Address Decoder PAD for a cache. A PAD is a decoder which has programmable mapping function. As mentioned before, caches have an intrinsic redundancy since the purpose of caches is to improve performance. Many processing architectures can work without any cache but at the cost of degraded performance. Therefore, introducing additional redundancy, like spare memory blocks, is inefficient.

During operation usually not all of the sets in a cache are used at the same time because of the spatial and temporal locality of memory references. Accordingly, there must be some—currently unused—cache sets which can substitute the spare blocks. When a memory reference occurs, a decoder maps this to the appropriate block. Once a faulty block is identified, a PAD automatically redirects access to that block to a healthy block in the same primary cache. If a cache with a PAD has n cache blocks and one block is faulty, the cache will work as if it has n-1 cache blocks. The PAD re-configures the mapping function so that a 'healthy' block acts as a spare block. The method to find suitable defect-free block is predefined and implemented in hardware.

There are three different ways that the mapping can be performed. In a Direct Mapped Cache, which is the simplest way to allocate the cache to the system memory, it is determined how many cache lines are present and the system memory is divided into the same number of portions. Then each portion is used by one cache line. The Fully Associative Cache makes it possible to design a cache, such that any line can store the contents of any memory location, instead of hard-allocating cache lines to particular memory locations. The third cache mapping scheme is the N-Way Set Associative Cache. This scheme constitutes a compromise between the direct mapped and fully associative designs. The cache is divided into sets, where each set contains N cache lines, i.e. N ways. Then, each memory address is assigned to a set, and can be cached in any one of those N locations within the set that it is assigned to. In other words, within each set the cache is associative. Accordingly, there are "N" possible places that a given memory location may be in the cache. The mapping is usually integrated in a tag RAM address decoder, which constitutes the area in an L2 cache that identifies which data from main memory is currently stored in each cache line. The values stored in the tag RAM determine whether a cache lookup results in a hit or a miss.

For instance, each way of a 4-way associative cache can have separate PADS. Therefore, cache addresses for faulty blocks are remapped to correct blocks within said way. All addresses are still cacheable, but conflict misses are increased. For direct-mapped caches, since at least one address bit information is lost as a consequence of remapping, at least one bit is augmented to the tag bits in order to be able to distinguish those addresses that may be mapped to the same block. The cache remapping is performed on a per-block basis, wherein a faulty block is mapped to a "healthy" one, which address differs from the address of the faulty block by merely one bit. Usually, for set-associative caches a separate memory array is provided for each way, so that a decoder can be associated to each array. Accordingly, the remapping is performed merely in one array or way and will not affect the mapping of the other arrays.

SUMMARY OF THE INVENTION

It is an object of the invention to enable a performance versus yield trade-off for faulty caches.

This object is solved by an integrated circuit according to claim 1, and a method of cache remapping according to claim 8.

Therefore, an integrated circuit is provided with at least one processing unit TM, a cache memory L2_BANK having a plurality of memory modules, and remapping means RM for performing an unrestricted remapping within said plurality of memory modules.

Accordingly, faulty modules can be remapped without limitations in order to optimise the utilization of the memory modules by providing an even distribution.

According to an aspect of the invention, the cache memory L2_BANK is implemented as a set-associative cache, resulting in a faster cache.

According to a further aspect of the invention, said remapping means performs the remapping on the basis of a programmable permutation function being one implementation of even distributing faulty parts of caches.

According to still a further aspect of the invention said remapping means performs the remapping on the basis of a reduction mapping. Accordingly, fewer elements are output than are input. Therefore, reduction mapping provides a greater degree of freedom for remapping faulty modules.

According to a preferred aspect of the invention, a Tag RAM unit TagRAM is associated to said cache and is used to identify, which data is cached in said cache memory L2_BANK. Furthermore, said remapping means is arranged in series with said Tag RAM unit TagRAM. Such an implementation is cheaper, since less chip area is required.

According to a further preferred aspect of the invention, a Tag RAM unit TagRAM is associated to said cache and is used to identify which data is cached in said cache memory L2_BANK. Furthermore, said remapping means is arranged in parallel to said Tag RAM unit TagRAM. This implementation is faster, since the remapping is performed in parallel to the Tag RAM.

The invention also relates to a method of cache remapping in an integrated circuit having at least one processing unit PU, and a cache memory L2_BANK having a plurality of memory modules for caching data from said main memory MM. An unrestricted remapping is performed within said plurality of memory modules.

The invention is based on the idea to improve the yield of a cache by exploiting the redundancy within a cache. In a cache entire memory modules can be interchanged such that faulty modules are not used anymore. The available working modules may be reshuffled such that each memory bank comprises at least one way. Preferably, the reshuffling is performed such that the faulty modules are distributed evenly over the memory banks, whereby the highest (guaranteed) associativity and therefore performance is achieved.

The invention will now be described in detail with reference to the figure.

PREFERRED EMBODIMENTS OF THE INVENTION

Figure 1:
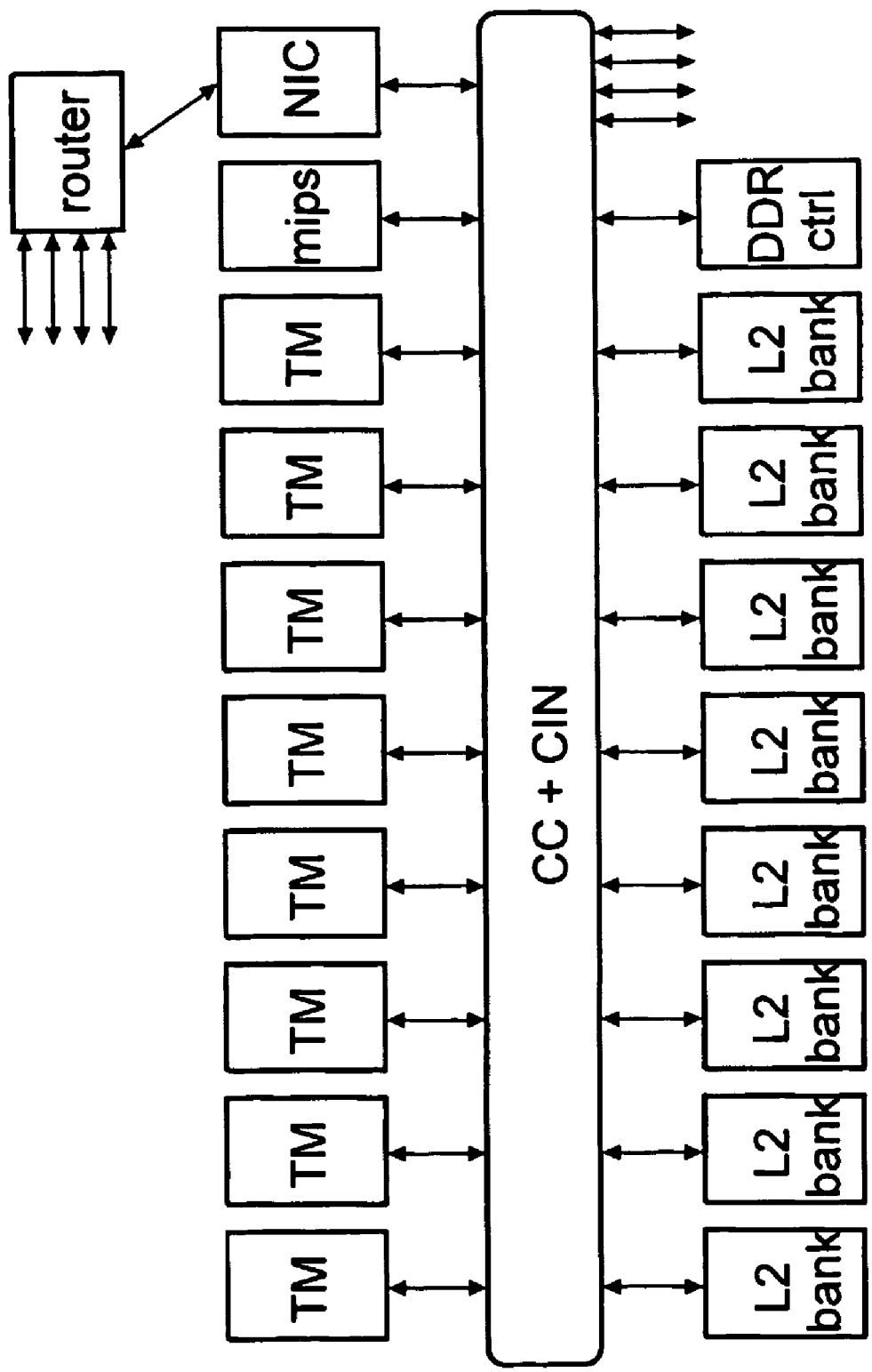
FIG. 1 shows an overall system architecture.

FIG. 1 shows an overall system architecture, where the principles of the invention may be implemented. This architecture may constitute a heterogeneous shared memory system containing 8 processing units TM, one MIPS processor mips, a DDR double data rate DRAM controller DDR_ctrl, and a 12 Mb shared L2 cache L2_bank. The caches L2_bank, the processing units TM, the controller DDR_ctrl as well as the processor mips are connected to each other via a coherent interconnection network CIN, which also comprises a cache controller CC. A network interface controller NIC is provided to handle the high-speed communication with other parts of the overall processing system. The processing unit is preferably a Trimedia processor running at 400 MHz.

The L2 cache is a level 2 cache, i.e. a cache which is shared by several processors, and is implemented preferably as embedded DRAM modules. Its design parameters may be as follows: a capacity of 12 MB, the associativity is 6 ways, the number of sets is 4096, the line size is 512 Byte, the refill size is 1 line, the concurrent transfers are based on 8 banks, a bank word size is 64 bits, the coherence policy is MESI, and the tag size is 11 bits. Accordingly, the L2 cache is partitioned into 8 banks and each bank can serve a read or write request independently from the other banks. Each bank is partitioned in six ways; each way has a capacity of 32 k 64 bit=2 Mbit. Only one way can be active in a bank at any given time.

Although the above architecture has been described in great detail with reference to FIG. 1, the principles of the invention may also be implemented in an architecture with only one processor and one cache.

Figure 2:
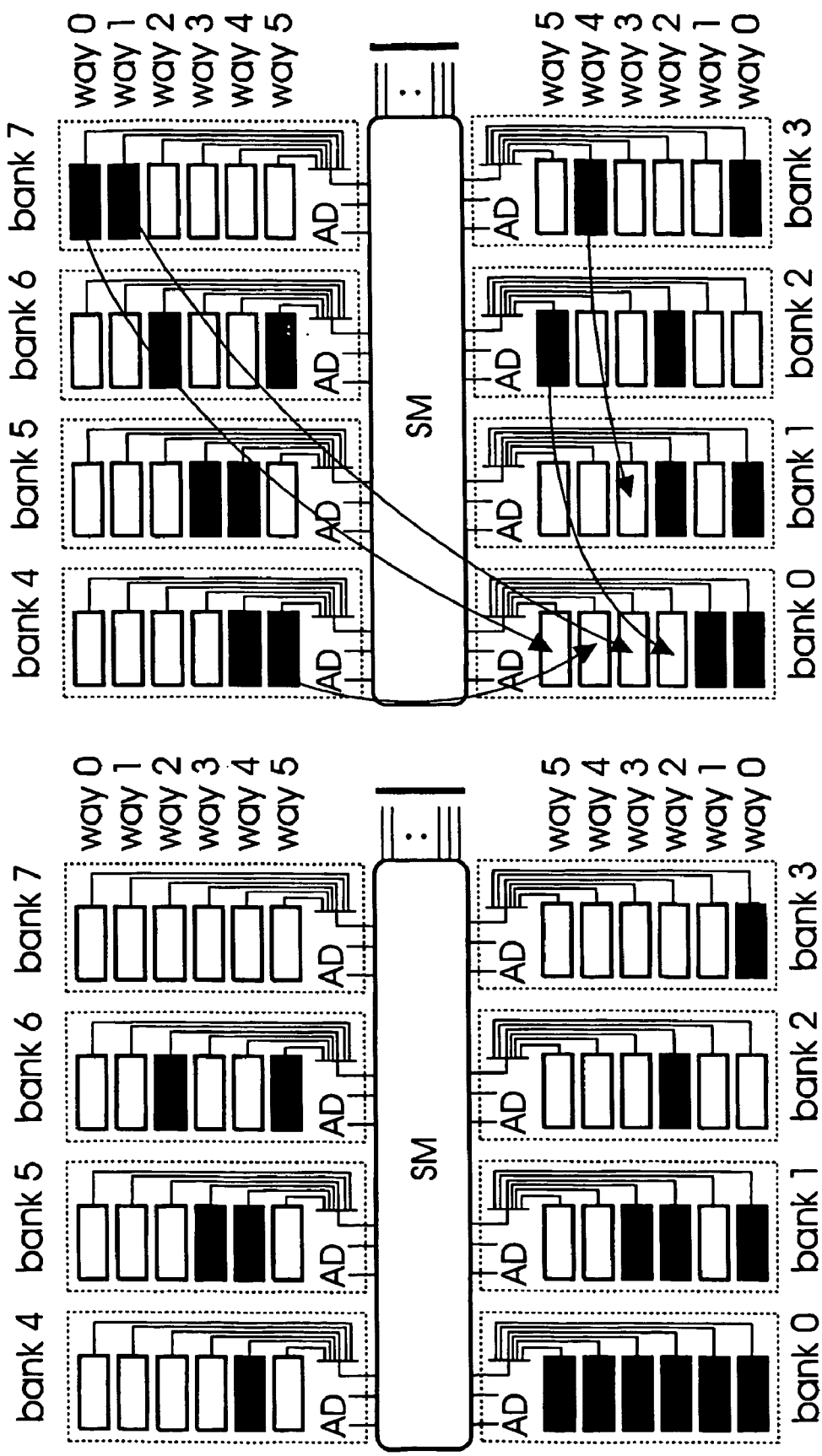
FIG. 2 shows cache modules before and after a remapping operation.

As described above, a remapping of cache modules is desirable in order to improve the performance of the cache or to trade-off the performance versus the yield, in order to achieve a working system. FIG. 2 shows cache modules L2_bank before and after a remapping operation. In particular, the cache modules before the remapping are shown on the left hand side, while the cache modules after remapping are shown on the right hand side.

At start-up, and after the detection of the faulty modules, the modules need to be remapped. This remapping is mainly done for performance reasons. By distributing the faulty modules/ways evenly over the banks, the highest associativity can be achieved. Accordingly, this even distribution provides a guaranteed associativity, whereby enhancing the performance. For the case that all modules/ways of a bank are faulty and the cache can not be bypassed, it is a matter of correctness to perform a remapping such that at least 1 way is available per bank, i.e. so that a direct mapped cache is achieved.

FIG. 2 depicts how modules can be remapped to achieve a well balanced way distribution. The boxes filled with black depict faulty modules. Note that before remapping, bank0 did not have any correct ways, while it has four ways after remapping. This is achieved by remapping the module in bank 7, ways0 and way 1 to bank0, way3, way5; the module in bank4, and way5 to bank0, way4; the module from bank2, way5 to bank0,way2; and the module from bank3, way4 to bank1, way 3. After remapping, every bank has 4 working ways.

Figure 3:
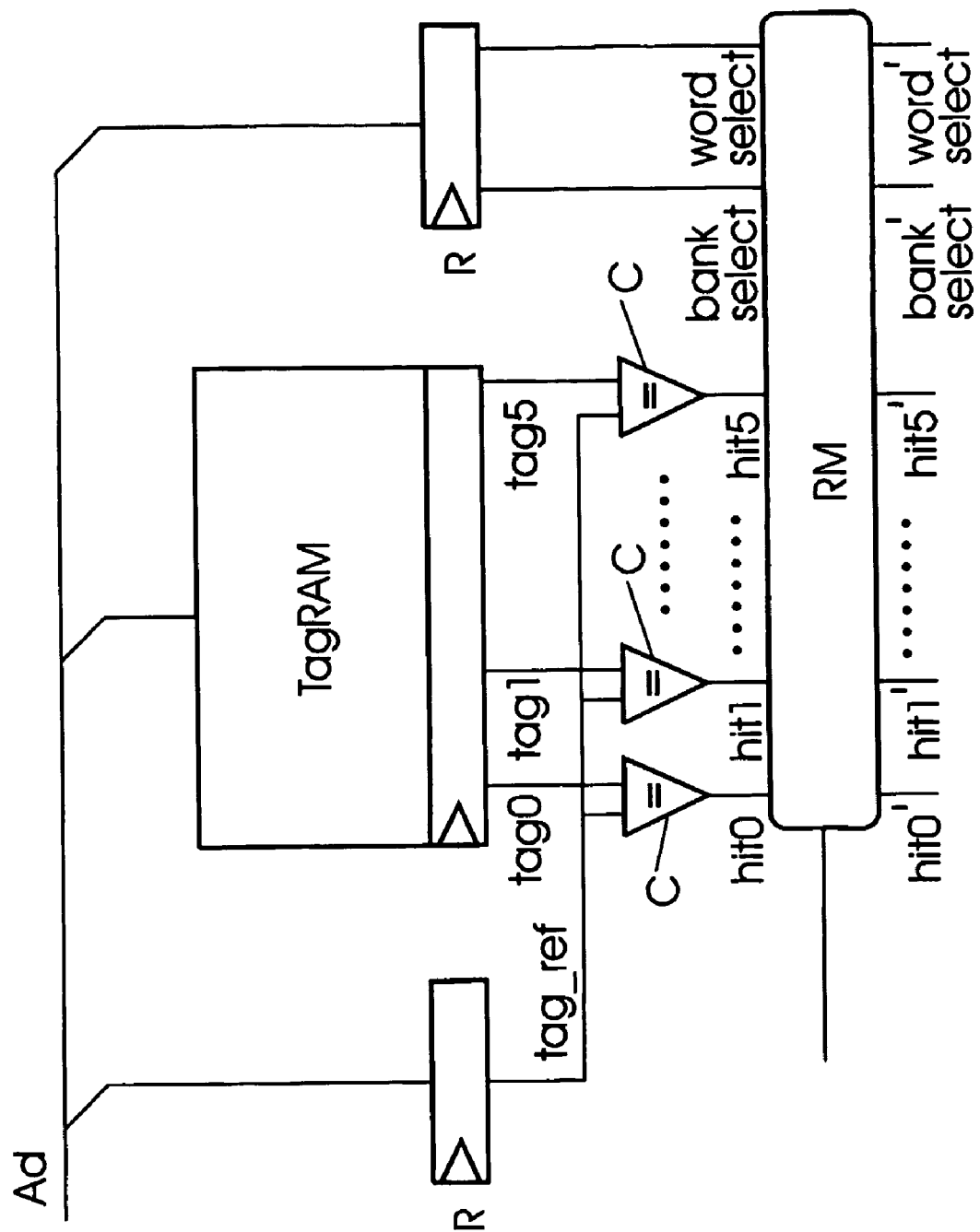
FIG. 3 shows an arrangement of a select signal circuitry of a cache according to a first embodiment.

FIG. 3 depicts the select signal circuitry for the L2 cache according to a first embodiment. In FIG. 3 a tag RAM unit TagRAM, a remapping means RM, two registers R and a plurality of comparators C are shown in FIG. 3. The pipeline registers R receive the address Ad as input signal, while one register R provides a tag reference signal tag_ref as output, and the other register provides a bank selection signal bank_select and a word selection signal word_select as output. The tag RAM unit TagRAM receives the address Ad as input and outputs the signals tag0, . . . , tag5. These signals and the tag reference signal tag_ref are input signals of the comparators C, respectively, which output the hit signals hit0, ..., hit5. These hit signals, the bank select signal bank_select and the word selection signal word_select are input to the remapping means RM, where the remapping operation is performed and the input signals are mapped to hit'0, ... hit'5, bank'select, and word_select representing the new remapped position of the cache module. The function and operation of the Tag RAM unit is well known in the art and will therefore not be described in detail.

The signal for selecting a bank bank_select is used to select one of the eight banks bank0 to bank7. The hit signal hit0, ... ,hit5 identifies a way in the bank selected by the bank select signal bank_select. The word selecting signal word_select is used to access a word in the (32 k 64) way. The remapping means RM is placed after the hit and bank select signals, i.e. in series to the Tag RAM unit TagRAM. The remapping means RM preferably implements a module permutation function which results in bank_select' and hit0' ... hit5' selecting remapped modules. The permutation function is a process of generating an alternative arrangements of given data and can for example be implemented with a register file of 48 (6*8) registers of 9 bits each (with 6 ways selects plus 3 (encoded) bank selects). The permutation is performed without reducing the number of inputs. Additionally, the word_select signals may also be remapped. This can be desirable if a way-bank combination itself consists of multiple memory modules. Alternatively, the remapping can be performed on the basis of a reduction mapping, i.e. less output symbols than input symbols.

However, the registers R and the register in the output stage of the memories are not essential for the operation and are merely a matter of pipelining.

Figure 4:
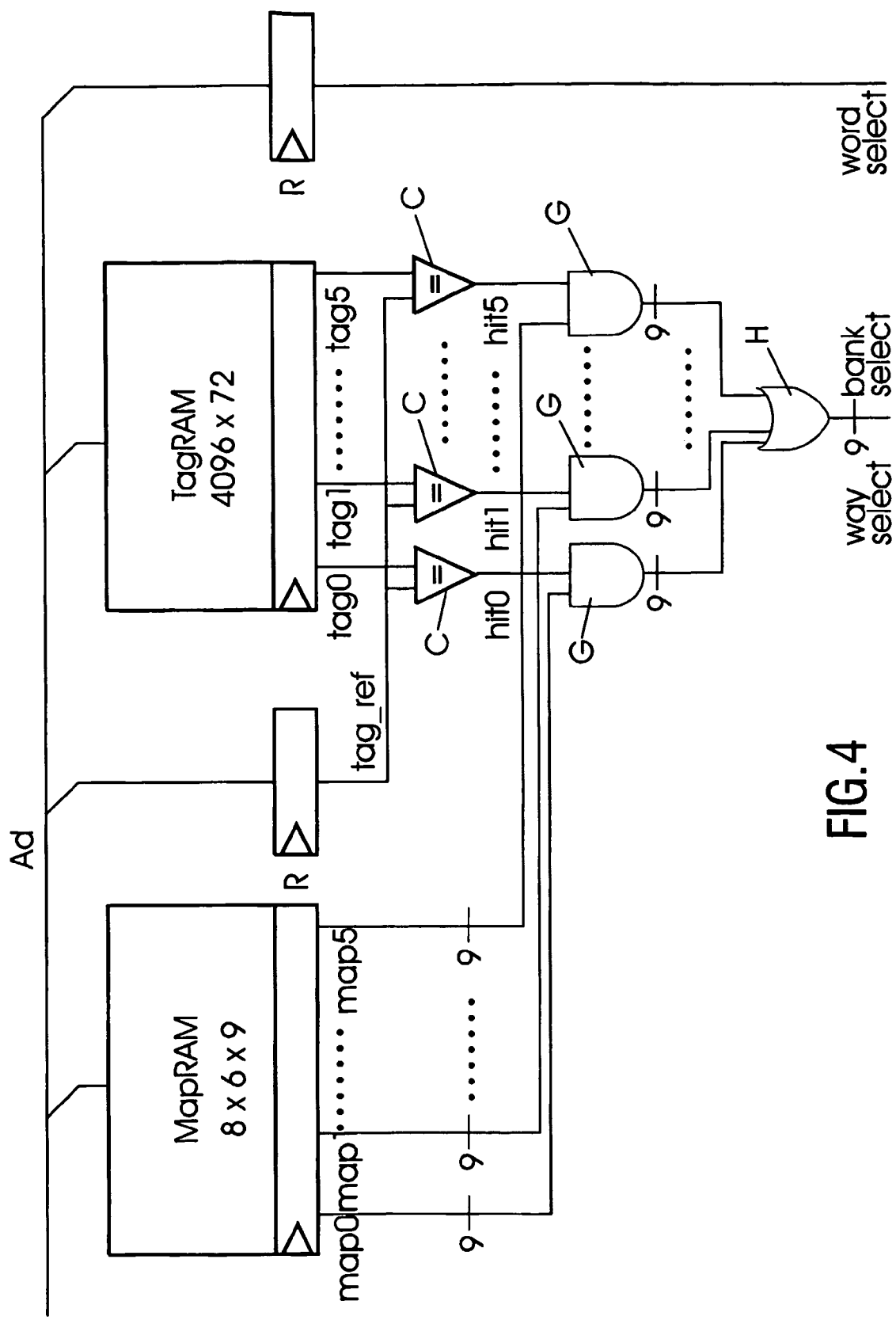
FIG. 4 shows an arrangement of a select signal circuitry of a cache according to a second embodiment.

FIG. 4 shows an alternative implementation for remapping modules according to a second embodiment. The selection circuitry is based on the selection circuitry according to the first embodiment, however the remapping means RM is replaced by a Map RAM unit MapRAM. The MapRAM may be implemented as an ordinary RAM with its address being a bank number, and outputting 9 bits for each of the 6 ways. These bits consist of the remapped way and the remapped bank (together addressing a remapped module). While according to the first embodiment the remapping unit RM is implemented in series to the Tag RAM unit, the Map RAM unit is implemented in parallel to the Tag RAM unit. The Map RAM unit receives the address Ad as input and outputs a mapping signal map0, ... map5. Accordingly, the remapping for each way of the addressed bank is looked up in parallel with the tag lookup, i.e. the Tag RAM unit. The mapping signals map0, ..., map5 as well as the hit signals hit0, ... hit5 from the comparators C constitute input signals into six AND-Gates G, respectively. The outputs of these gates G are fed to an OR-Gate H. The output of the gate H constitutes the way select signal way_select and the bank select signal bank_select. Furthermore, the address is inputted to a register R, which outputs the word select. The hitting way then selects which of the 6 pre-selected remappings map0, ..., map5 is to be performed.

The registers R in the second embodiment are not essential. The AND gates and OR gates occur 6*9 times and 9 times, respectively. However, this function may also be implemented for example using a multiplexer.

To further improve the performance of the selection circuitry according to the first and second embodiment, the cache hits and the cache line replacements should not target any faulty modules. In order to avoid this, a look-up table is preferably provided in the Tag RAM unit, but can also be implemented in the remapping unit RM or in the MAP RAM unit. The idea behind the look up table is to be able to avoid hits on all blocks of a faulty module, and furthermore to exclude such a module from being a replacement target. If the valid and lock bits are already implemented in a cache, the implementation of FIG. 5 is basically for free.

Figure 5:
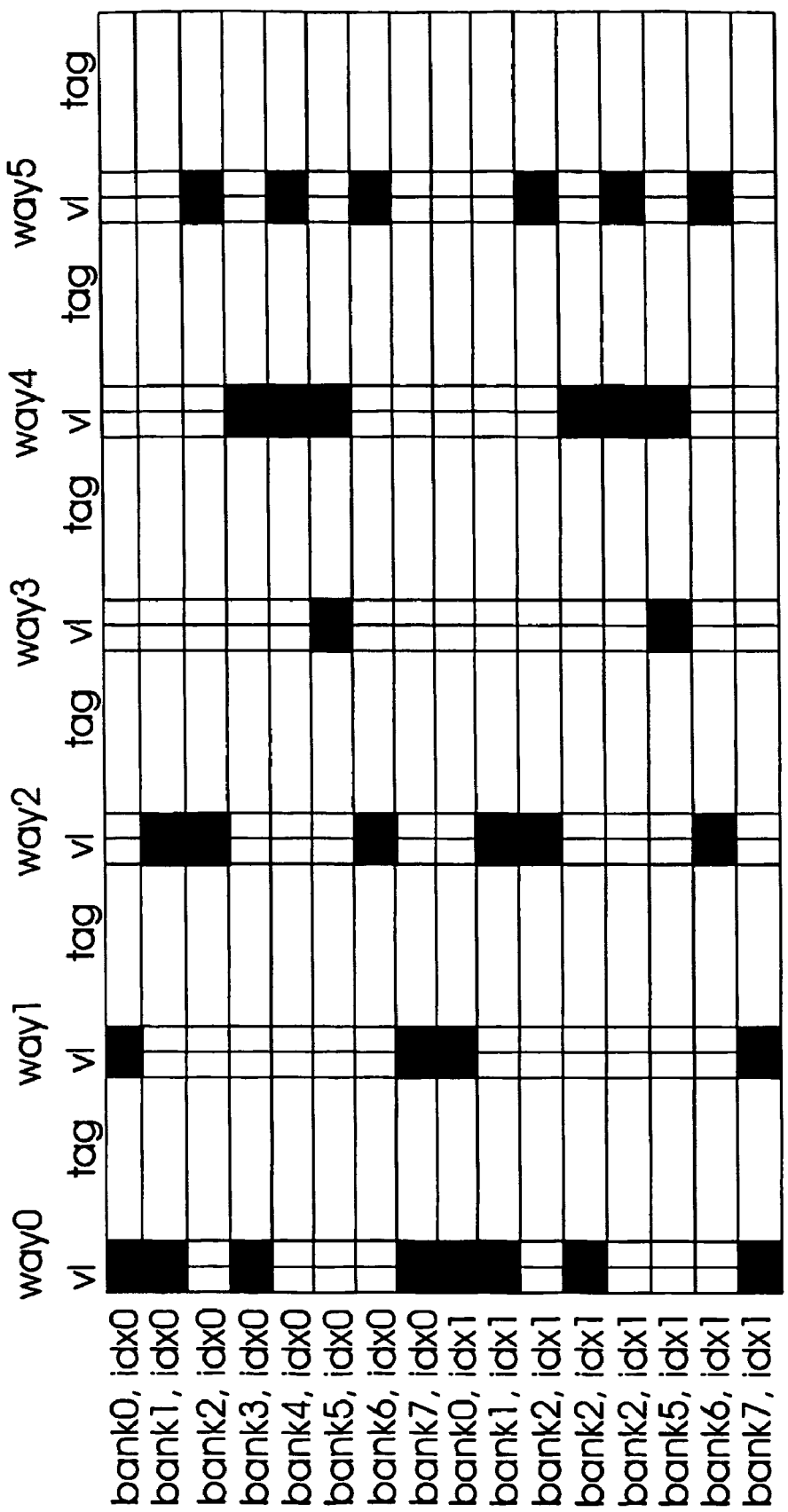
FIG. 5 shows a look up table for a remapping according to FIG. 2.

FIG. 5 shows a representation of such a table for a remapping according to FIG. 2. Faulty modules are marked as unusable by setting the lock as well as the invalid bits.

According to a third embodiment, which is based on the first embodiment, i.e. arranging the Tag RAM unit and the remapping means RM in series, the remapping may also be performed at a finer granularity, e.g. on a block/line level instead of module level according to the first and second embodiment. This results in an additional circuit modifying the addresses indexing the tag RAM. A preferred mapping is performed by remapping certain addresses to the same index, e.g. by mapping block0 and block1 to the same index/block by ignoring the least significant address bit. If multiple addresses map to the same index, the tag RAM is augmented with the missing address information. A widened tag comparison can be used to resolve the ambiguity. This has the advantage, that it can easily be integrated with the address decoder. If the ambiguity problem (with wider tags and tag comparisons) is to be avoided, then the address mapping has to be a permutation which in turn is impractical at a block level. Moreover, address remapping becomes less attractive in cases of a hard RAM macro with an integrated address decoder.

According to a fourth embodiment, which is based on the second embodiment, the module remapping can be extended to block-level remapping by adding a mapping per block. The map RAM according to the second embodiment is then extended to one entry per block. Accordingly, the map RAM and the tag RAM according to the second embodiment can be combined.

Figure 6:
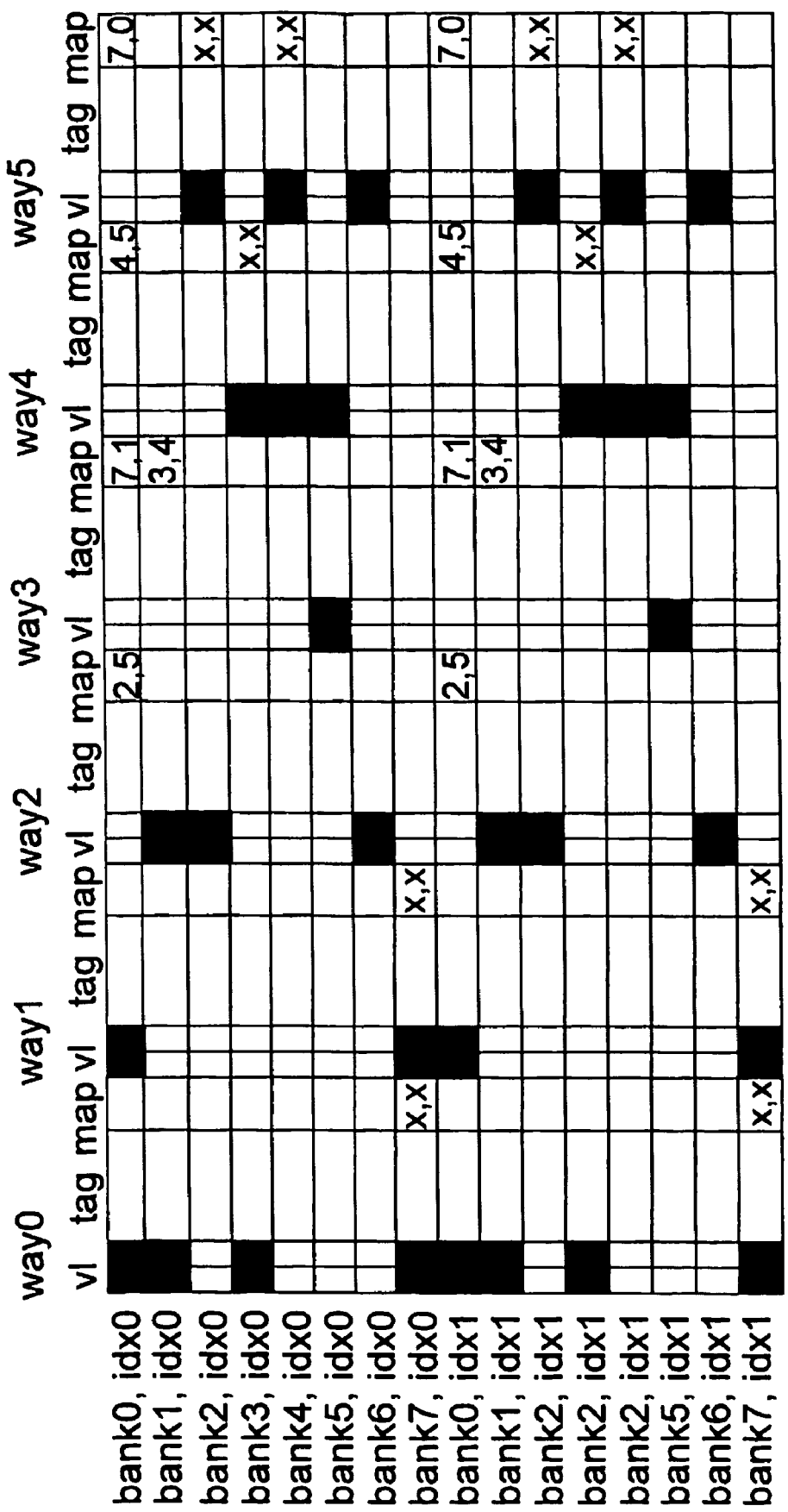
FIG. 6 shows a look up table according to a fourth embodiment.

In FIG. 6 a look-up table is shown, which represents a look up table of a combined map RAM and the tag RAM according to the fourth embodiment. Additionally, compared with the look up table according to FIG. 5, the table according to FIG. 6 comprises an extra column, i.e. the map column, for each way. This column contains the remapping information, e.g. the block at (index0,bank0,way2) gets remapped to (index0, bank2,way5), since the values 2 and 5 are written into the corresponding map field. In order to realise a cheap and fast implementation, a block is preferably not remapped to a different index, but merely to a new way and bank. However, the remapping may alternatively also be performed over several indexes.

The remapping means may comprise a programmable permutation unit which indicates the module-to-module mapping, a circuit using this permutation to reshuffle modules by recomputing module selects, and/or a mechanism to permanently invalidate the tag rams associated with a faulty module (after remapping).

The difference between the remapping scheme according to the invention and remapping schemes related to main memories with redundant modules for replacing faulty modules is that in a cache there are no really "redundant" modules, since each module contributes to the associativity and thus the performance. The advantage is that there is no need for spare modules, i.e. modules that are not used unless they replace some faulty modules.

For performance reasons it is desirable to maximise the associativity of the cache. Therefore, if there are N faulty modules in M sets, we have N/M faulty modules per set. Accordingly, the faulty modules should be distributed such that the value of N/M is realised and the faulty modules are distributed evenly.

Although the principles of the invention have been described with an implementation of a L2 (level 2) cache, the above principles may also be implemented for any other caches, like L1 (level 1) caches. However, this solution might not be attractive for L1 caches, since an unwanted critical path may be increased and since L1 caches typically are not very big.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. An integrated circuit, comprising:
at least one processing unit (PU);
a cache memory (L2_bank) having a plurality of memory modules for caching data, wherein the cache memory comprises a plurality of distinct physical banks, wherein each physical bank comprises some of the memory modules and is configured to facilitate serving a read/write request independently of other physical banks to allow concurrent transfers for at least two of the physical banks; and
signal selection circuitry for identifying which memory modules have data cached in said cache memory wherein the signal selection circuitry comprises:
a Tag RAM unit (TagRAM) to generate a hit signal based on an input address, wherein the hit signal is indicative of an originally mapped way for data corresponding to the input address; and
remapping means (RM, MapRAM) for performing a remapping within said plurality of memory modules, wherein the remapping permits remapping the memory modules from a first physical bank of memory modules to a second physical bank of memory modules, wherein the remapping means is configured to generate a hit' signal based on the hit signal from the Tag RAM unit, wherein the hit' signal is indicative of a remapped way for the data corresponding to the input address.

2. The integrated circuit according to claim 1, wherein said cache memory (L2_BANK) is a set-associative cache.

3. The integrated circuit according to claim 1, wherein said remapping means is adapted to perform the remapping on the basis of a programmable permutation function.

4. The integrated circuit according to claim 1, wherein said remapping means is adapted to perform the remapping on the basis of a reduction mapping, wherein the reduction mapping performs the remapping using less output symbols than input symbols.

5. The integrated circuit according to claim 1, further comprising:
wherein said remapping means is arranged in series with said Tag RAM unit (TagRAM) to receive the hit signal from the Tag RAM unit for use in generating the hit' signal indicative of the remapped way.

6. The integrated circuit according to claim 5, further comprising:
a look up table for marking faulty memory modules.

7. The integrated circuit according to claim 1, further comprising:
wherein said remapping means is arranged in parallel to said Tag RAM unit (TagRAM) to generate a plurality of remapped banks and ways corresponding to the input address, wherein the remapped banks and ways corresponding to the input address are generated independently of the hit signal from the Tag RAM unit and are subsequently processed together with the hit signal from the Tag RAM unit by selection logic to generate the hit' signal indicative of the remapped way.

8. The integrated circuit according to claim 1, wherein the remapping means is further configured to distribute faulty memory modules evenly over a plurality of banks.

9. The integrated circuit according to claim 1, wherein the remapping means is further configured to perform the unrestricted remapping at a block/line granularity of the memory modules.

10. The integrated circuit according to claim 1, wherein the remapping means is further configured to remap at least one of the memory modules from an index within the first physical bank of memory modules to a new way and a different index within the second physical bank of memory modules.

11. The integrated circuit according to claim 1, wherein said cache memory comprises a plurality of dynamic random access memory (DRAM) modules.

12. The integrated circuit according to claim 1, wherein the remapping means is further configured to remap at least one of the memory modules to a new way and a same index within the second physical bank of memory modules.

13. The integrated circuit according to claim 1, wherein each physical bank of memory modules is located on a separate DRAM module.

14. A method of cache remapping in an integrated circuit having at least one processing unit (PU); a main memory (MM) for storing data; and a cache memory (L2_BANK) having a plurality of memory modules for caching data, the method comprising:
generating a hit signal based on an input address, wherein the hit signal is indicative of an originally mapped way for data corresponding to the input address;
performing a remapping within said plurality of memory modules wherein the memory modules are distributed among a plurality of distinct physical banks within the cache memory, and each physical bank is configured to facilitate serving a read/write request independently of the other physical banks to allow concurrent transfers for at least two of the physical banks, wherein the remapping permits remapping the memory modules from a first physical bank of memory modules to a second physical bank of memory modules; and
generating a hit' signal based on the hit signal, wherein the hit' signal is indicative of a remapped way for the data corresponding to the input address.

15. The method of cache remapping according to claim 14, further comprising performing the unrestricted remapping on the basis of a reduction mapping using less output symbols than input symbols.

16. The method of cache remapping according to claim 14, further comprising marking faulty memory modules in a look up table.

17. The method of cache remapping according to claim 14, wherein said cache memory comprises a plurality of dynamic random access memory (DRAM) modules.

18. The method of cache remapping according to claim 14, further comprising remapping at least one of the memory modules to a new way and a same index within the second physical bank of memory modules.

19. The method of cache remapping according to claim 14, further comprising remapping at least one of the memory modules to a new way and a different index within the second physical bank of memory modules.

20. The method of cache remapping according to claim 14, wherein each physical bank of memory modules is located on a separate DRAM module.

* * * * *